United States Patent
Yano et al.

(10) Patent No.: US 11,598,822 B2
(45) Date of Patent: Mar. 7, 2023

(54) LEAKAGE VOLTAGE DETECTION SYSTEM AND LEAKAGE VOLTAGE DETECTION METHOD

(71) Applicant: Hitachi, Ltd., Tokyo (JP)

(72) Inventors: Tomohiko Yano, Tokyo (JP); Takashi Kawamoto, Tokyo (JP); Hideyuki Nagaishi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 17/355,948

(22) Filed: Jun. 23, 2021

(65) Prior Publication Data
US 2022/0099755 A1 Mar. 31, 2022

(30) Foreign Application Priority Data
Sep. 25, 2020 (JP) .............................. JP2020-161505

(51) Int. Cl.
*H02H 3/00* (2006.01)
*G01R 31/52* (2020.01)
*H02H 3/20* (2006.01)
*H02H 1/00* (2006.01)
*G01R 1/067* (2006.01)

(52) U.S. Cl.
CPC ......... *G01R 31/52* (2020.01); *G01R 1/06766* (2013.01); *H02H 1/0007* (2013.01); *H02H 3/20* (2013.01)

(58) Field of Classification Search
None
See application file for complete search history.

(56) References Cited

U.S. PATENT DOCUMENTS

| | | | |
|---|---|---|---|
| 5,245,191 A * | 9/1993 | Barber | G01T 1/295 250/363.04 |
| 2006/0052956 A1 | 3/2006 | Lee | |
| 2019/0208612 A1 * | 7/2019 | Yehle | B32B 27/42 |

FOREIGN PATENT DOCUMENTS

JP        2008-510448 A      4/2008

* cited by examiner

*Primary Examiner* — Stephen W Jackson
(74) *Attorney, Agent, or Firm* — Crowell & Moring LLP

(57) ABSTRACT

A leakage voltage detection system can be easily mounted on a ground structure such as an existing street light or a traffic light and can detect a leakage voltage of an electric structure in real time. The leakage voltage detection system includes a sensor node mounted on a ground structure, and an equipment management server that determines a risk of a leakage voltage in the ground structure based on detection voltage information from the sensor node. The sensor node includes an electric field probe that measures a potential difference caused by an electric field detected by electrodes, and a sensor box that detects the potential difference between the electrodes of the electric field probe and transmits the potential difference to the equipment management server as a detection voltage. The equipment management server determines the risk of the leakage voltage where the sensor node is mounted based on the received detection voltage from the sensor node, and outputs information on determination of the risk of the leakage voltage.

6 Claims, 12 Drawing Sheets

FIG. 5

SENSOR DATA MEASUREMENT TABLE  800

| SENSOR NODE ID (800a) | MEASUREMENT TIME (800b) | DETECTION VOLTAGE [mV] (800c) |
| --- | --- | --- |
| 10 | 20200818122032 | 0.5 |
| 10 | 20200818122232 | 1.0 |
| 10 | 20200818122432 | 1.2 |
| 11 | 20200819141005 | 0.8 |

LEAKAGE VOLTAGE DETECTION SYSTEM AND LEAKAGE VOLTAGE DETECTION METHOD

BACKGROUND OF THE INVENTION

1. Field of the Invention

The present invention relates to a leakage voltage detection system and a leakage voltage detection method, and particularly to a leakage voltage detection system that detects a leakage voltage of a ground electric structure such as a street light or a traffic light in real time to prevent an electric shock accident and has an advantage of being easy to mount, and a leakage voltage detection method.

2. Description of the Related Art

In general, a ground structure using electricity such as a street light or a traffic light installed on a road, a park, or the like, is installed outdoors, and thus an insulation failure due to flooding by rain or an aged deterioration of coating of an electric wiring or a connector portion by a severe temperature and humidity cycle is likely to occur, and a leakage voltage is likely to be generated on a surface of the ground structure. Here, the leakage voltage is a voltage generated between a leakage place when an accident current flows to the ground structure and the ground. Since ground structures are often installed in a public place, the ground structures may be touched by people and an electric shock accident may occur due to the leakage voltage. Therefore, a maintenance provider of electrical equipment needs to quickly detect the leakage voltage, isolate the leakage voltage, and repair an accident location.

For example, JP-T-2008-510448 discloses a device for detecting a leakage voltage of a ground structure. In an electric shock accident prevention device described in JP-T-2008-510448, a leakage voltage sensing rod monitors the leakage voltage of the ground structure, and energization is stopped by a breaker when the leakage voltage is detected, thereby preventing an electric shock accident.

JP-T-2008-510448 in the related art described above discloses a device that prevents an electric shock accident by detecting the leakage voltage with a plurality of leakage voltage sensing rods and shutting off an AC power supply when an abnormality occurs.

However, two leakage voltage sensing rods in JP-T-2008-510448 are necessary, one for a reference potential and the other for the ground structure, to measure a potential of the ground structure from the reference potential, and it is necessary to electrically connect the ground and the leakage voltage sensing rod since the reference potential of the leakage voltage is earth (ground). At this time, in order to make an electrical connection with the ground, it is necessary to drive a grounding rod into the ground or connect the grounding rod to another grounded ground structure that is sufficiently far from the grounding structure to be monitored for the leakage voltage, which may lead to a high cost since there are many man-hours for ensuring the ground. Further, it is problematic from a viewpoint of safety to route a ground wiring from the ground structure to the surroundings on the road, and it is difficult to retrofit an existing ground structure with a leakage voltage detection device.

SUMMARY OF THE INVENTION

An object of the invention is to provide a leakage voltage detection system that can be easily mounted on a ground structure such as an existing street light or a traffic light and can detect a leakage voltage of the electric structure in real time.

According to a configuration of a leakage voltage detection system of the invention, the leakage voltage detection system preferably includes a sensor node mounted on a ground structure, and an equipment management server that determines a risk of a leakage voltage in the ground structure based on detection voltage information from the sensor node. The sensor node includes an electric field probe that measures a potential difference caused by an electric field detected by electrodes, and a sensor box that detects the potential difference between the electrodes of the electric field probe and transmits the potential difference to the equipment management server as a detection voltage. The equipment management server determines the risk of the leakage voltage where the sensor node is mounted based on the received detection voltage from the sensor node, and outputs information on determination of the risk of the leakage voltage.

According to the invention, it is possible to provide a leakage voltage detection system that can be easily mounted on a ground structure such as an existing street light or a traffic light and can detect a leakage voltage of the electric structure in real time.

BRIEF DESCRIPTION OF THE DRAWINGS

FIG. 5 is a diagram showing an example of a sensor data measurement table;

DESCRIPTION OF THE PREFERRED EMBODIMENTS

Figure 1:
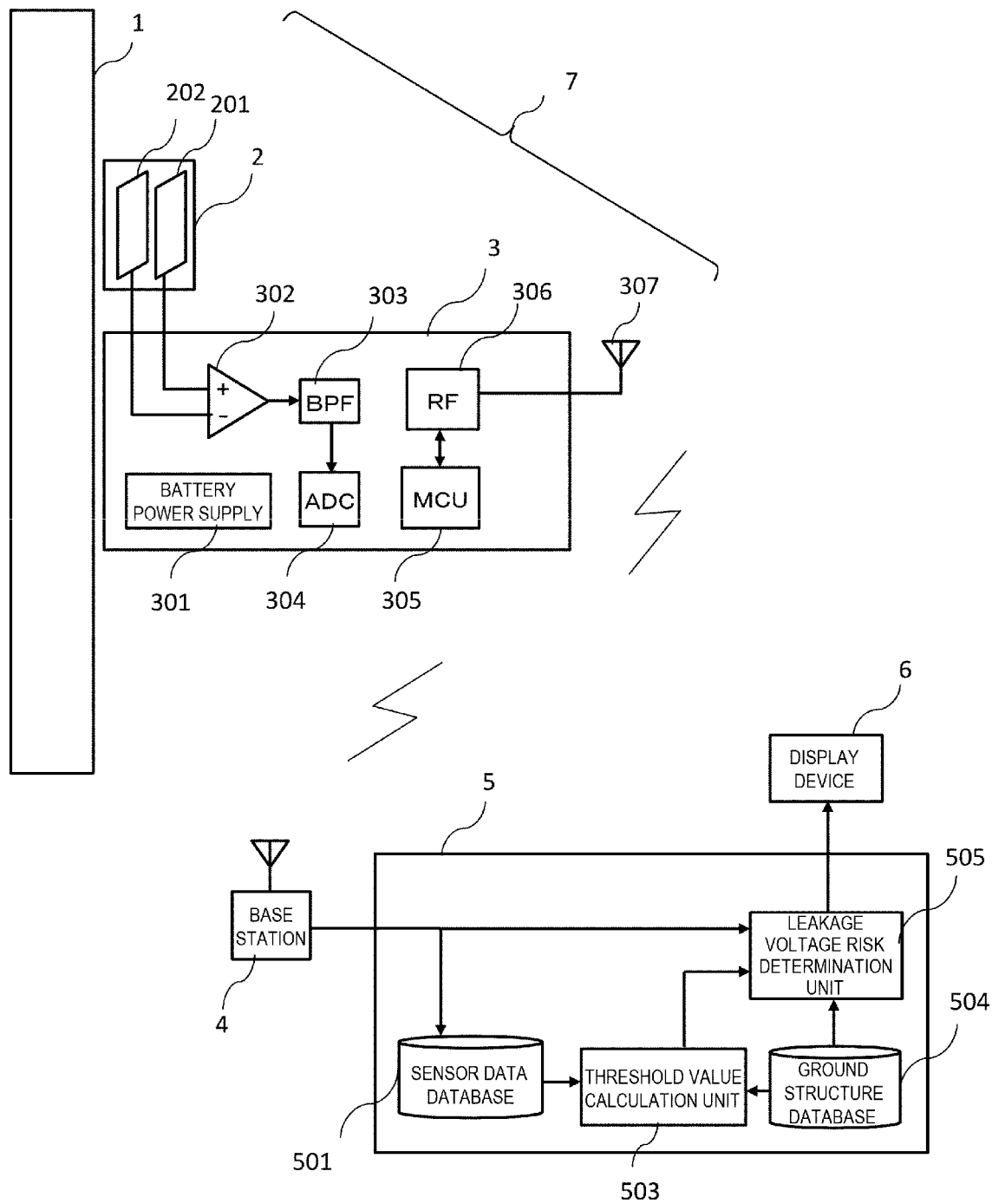
FIG. 1 is a configuration diagram of a leakage voltage detection system according to a first embodiment.

Hereinafter, embodiments of the invention will be described with reference to the drawings. The embodiments are examples for describing the invention, and omissions and simplifications are appropriately made to clarify the description. The invention can be implemented in various other forms. Unless otherwise limited, each component may be singular or plural.

In order to facilitate understanding of the invention, a position, a size, a shape, a range, or the like of each component shown in the drawings may not represent an actual position, an actual size, an actual shape, an actual range, or the like. Therefore, the invention is not necessarily limited to the position, the size, the shape, the range, or the like shown in the drawings.

Examples of various types of information may be described by expressions such as "table", "list", and "queue", and may also be expressed by a data structure other than these expressions. For example, the various types of information such as "XX table", "XX list", and "XX queue" may be "XX information". When identification information is described, expressions such as "identification information", "identifier", "name", "ID", and "number" are used, and these expressions may be replaced with each other.

When there are a plurality of components having the same or similar functions, different subscripts may be attached to the same reference numeral. In addition, when it is not necessary to distinguish the plurality of components from each other, a description will be given by omitting the subscript.

In the embodiments, processing performed by executing a program may be described. Here, a computer executes the program by a processor (for example, a CPU or a GPU), and performs the processing defined by the program using a storage resource (for example, a memory), an interface device (for example, a communication port), or the like. Therefore, a subject of the processing performed by executing the program may be the processor. Similarly, the subject of the processing performed by executing the program may be a controller, a device, a system, a computer, or a node including the processor. The subject of the processing performed by executing the program may be a calculation unit, and may include a dedicated circuit that performs a specific processing. Here, the dedicated circuit is, for example, a field programmable gate array (FPGA), an application specific integrated circuit (ASIC), or a complex programmable logic device (CPLD).

The program may be installed in the computer from a program source. The program source may be, for example, a program distribution server or a computer-readable storage medium. When the program source is the program distribution server, the program distribution server may include the processor and the storage resource that stores a program to be distributed, and the processor of the program distribution server may distribute the program to be distributed to another computer. In addition, in the embodiments, two or more programs may be implemented as one program, or one program may be implemented as two or more programs.

First Embodiment

Hereinafter, a first embodiment will be described with reference to FIGS. 1 to 7.

First, a configuration of a leakage voltage detection system according to the first embodiment will be described with reference to FIGS. 1 and 2.

As shown in FIG. 1, in the leakage voltage detection system of the present embodiment, a sensor node 7 is grounded to a ground structure 1 in which a leakage voltage is to be monitored, an equipment management server 5 collects measurement data measured there via a base station 4, and whether the leakage voltage is generated in the ground structure 1 is determined based on the measurement data.

The sensor node 7 mounted for each ground structure 1 includes an electric field probe 2 and a sensor box 3.

The electric field probe 2 is in contact with a surface of the ground structure 1, and is a mechanism that measures a surface electric field of the ground structure 1 by an outer electrode 201 and an inner electrode 202 and outputs a potential difference between the outer electrode 201 and the inner electrode 202. The sensor box 3 is a device that wirelessly transmits a detection voltage output from the electric field probe 2 to the base station 4 as the measurement data in the sensor node 7.

The base station 4 is a relay station that relays radio waves transmitted from the sensor box 3 and transmits the radio waves to the equipment management server 5. As for communication between the base station 4 and the sensor box 3, for example, a LoRa standard of a sub-GHz band can be used.

The equipment management server 5 is a server that analyzes the measurement data transmitted from the sensor box 3 and determines a risk of the leakage voltage in a structure in which the sensor box 3 is mounted. Information on the risk of the leakage voltage output by the equipment management server 5 is displayed on a display device 6, so that a manager can know which ground structure 1 measured by the sensor box 3 has a risk of electric leakage, and can take measures such as dispatching a maintenance worker as necessary.

The sensor box 3 includes a battery power supply 301, a potential difference acquisition unit 302, a band-pass filter (BPF) 303, an AD converter (ADC) 304, a microcomputer (MCU) 305, a high frequency unit (RF) 306, and an antenna 307.

The battery power supply 301 is a power supply mechanism for supplying electric power from a battery. The potential difference acquisition unit 302 is a mechanism that acquires a potential difference between the outer electrode 201 and the inner electrode 202. The band-pass filter 303 is a circuit that extracts a signal in a required frequency band (for example, around 50 Hz of an alternating current). The AD converter (ADC) 304 is a circuit that converts an input analog signal into a digital signal and outputs the digital signal. The microcomputer 305 is a circuit that processes the input digital signal. The high frequency unit (RF) 306 is a circuit that places the input signal on a high frequency and outputs the input signal. The antenna 307 is a radiation device that transmits the radio waves.

With this configuration, information on the electric field of the electric field probe 2 is transmitted to the equipment management server 5 via the base station 4 as information on the detection voltage in the sensor box 3. Here, since the electric field probe 2 can be attached to the surface of the ground structure without electrical contact and the sensor box 3 is battery-powered, a device can be easily retrofitted to an existing ground structure conveniently.

The equipment management server 5 analyzes data transmitted from the sensor box 3 via the base station 4, and determines a risky leakage voltage.

The equipment management server 5 includes a sensor data database 501, a threshold value calculation unit 503, a ground structure database 504, a leakage voltage risk determination unit 505, and the display device 6.

The sensor data database 501 is a database that stores and manages the measurement data transmitted from the sensor node 7. The threshold value calculation unit 503 is a functional unit that calculates a threshold value that is determined to be a risk in each sensor node 7. The ground structure database 504 is a database that stores information on a shape and a position of the ground structure 1. The leakage voltage risk determination unit 505 is a functional unit that determines whether the leakage voltage occurring in the ground structure is a risk based on the voltage measured by the sensor node 7. The display device 6 is a display device that displays information.

Next, a hardware and software configuration of the equipment management server 5 will be described with reference to FIG. 2.

Figure 2:
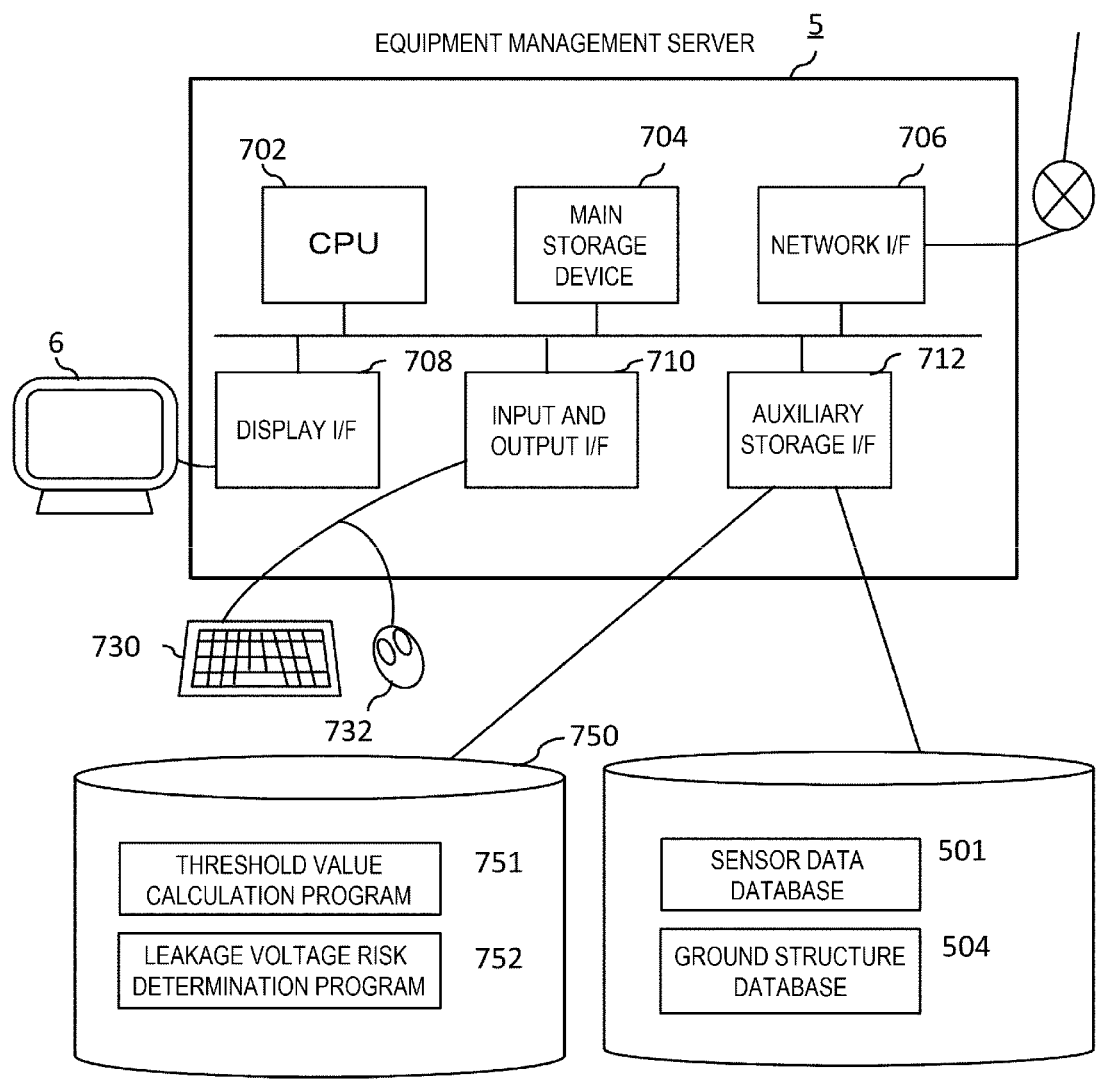
FIG. 2 is a hardware and software configuration diagram of an equipment management server.

A hardware configuration of the equipment management server 5 is implemented by, for example, a general information processing device such as a server device shown in FIG. 2.

In the equipment management server 5, a central processing unit (CPU) 702, a main storage device 704, a network inter face (I/F) 706, a display I/F 708, an input and output I/F 710, and an auxiliary storage I/F 712 are connected by a bus.

The CPU 702 controls components of the equipment management server 5, loads a necessary program into the main storage device 704, and executes the program.

The main storage device 704 is usually formed by a volatile memory such as a RAM, and stores a program executed by the CPU 702 and data to be referred to.

The network I/F 706 is an interface for connecting to a network connected to the base station 4.

The display I/F 708 is an interface for connecting the display device 6 such as a liquid crystal display (LCD).

The input and output I/F 710 is an interface for connecting an input and output device. In an example of FIG. 2, a keyboard 730 and a mouse 732 that is a pointing device are connected.

The auxiliary storage I/F 712 is an interface for connecting an auxiliary storage device such as a hard disk drive (HDD) 750 or a solid state drive (SSD).

The HDD 750 has a large-capacity storage capacity, and stores a program for carrying out the present embodiment. A threshold value calculation program 703 and a leakage voltage risk determination program 705 are installed in the equipment management server 5.

The threshold value calculation program 703 and the leakage voltage risk determination program 705 are programs that implement functions of the threshold value calculation unit 503 and the leakage voltage risk determination unit 505, respectively.

The HDD 750 stores the sensor data database 501 and the ground structure database 504. The sensor data database 501 holds a sensor data measurement table. Details of the sensor data measurement table will be described later.

Next, a configuration of the electric field probe 2 will be described with reference to FIGS. 3 and 4.

Figure 3:
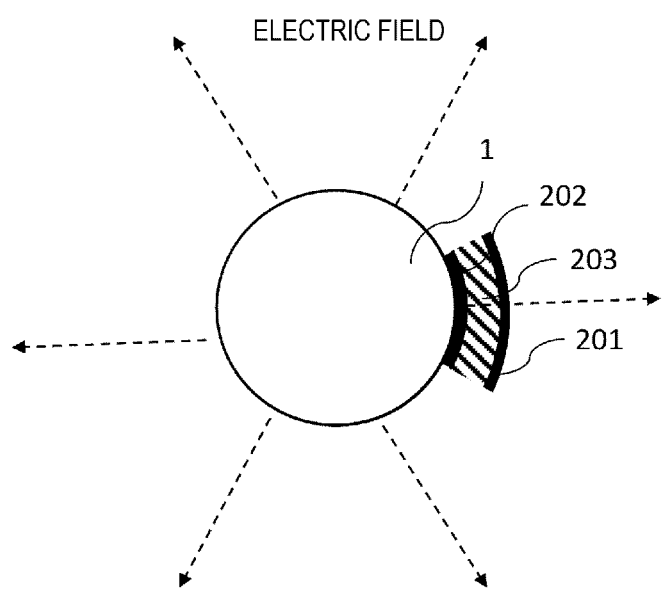
FIG. 3 is a configuration view of an electric field probe according to the first embodiment (part 1)

FIG. 3 is a cross-sectional view of the electric field probe 2 mounted on the columnar ground structure 1 in a horizontal plane. Here, the electric field probe 2 is mounted on the columnar ground structure 1, and the ground structure may be of a box shape. The electric field probe includes the inner electrode 202, the outer electrode 201, and a spacer 203 made of an insulator.

Each of the inner electrode 202 and the outer electrode 201 is a flat electrode made of a metal such as copper, and is mounted on the surface of the ground structure 1 in a manner of overlapping with the spacer 203. The ground structure 1 and the inner electrode 202 do not need to be electrically connected, and a gap may be provided or an adhesive material for holding the electric field probe may be sandwiched therebetween. When the leakage voltage is generated, an electric field is generated radially from the ground structure 1 as indicated by a dotted line in FIG. 3, and thus a voltage proportional to the electric field and a thickness of the spacer is generated between the inner electrode 202 and the outer electrode 201. This voltage is an output voltage of the electric field probe 2 and is detected by the sensor box 3.

Figure 4:
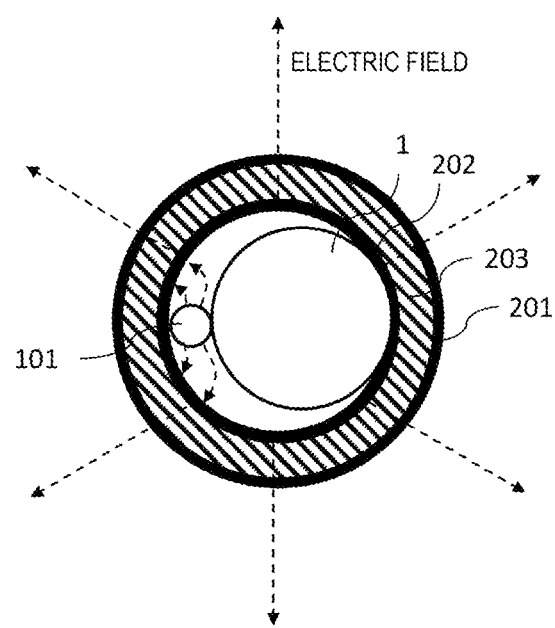
FIG. 4 is a configuration view of the electric field probe according to the first embodiment (part 2)

FIG. 4 shows another embodiment of the electric field probe 2 mounted on the columnar ground structure 1. In FIG. 4, the inner electrode 202 wraps around the columnar ground structure 1. An effect of this implementation method appears when an electric piping such as a piping 101, which has a risk of generating the leakage voltage, is laid along the columnar ground structure 1 that is an insulator such as a concrete utility pole. In such a case, the electric field is generated only on a surface of the piping 101 during leakage voltage generation time. Since such a piping has a small diameter, it may be difficult to mount an electrode as shown in FIG. 3, and an electric field distribution may be complicated, and it may be further difficult to derive a proportional constant to the leakage voltage. Therefore, by wrapping the inner electrode 202 around a circumference, the distribution of the electric field generated from the piping 101 can be made uniform in a circumferential direction, and the electrode can be easily mounted.

Next, the data structure of the sensor data measurement table will be described with reference to FIG. 5.

A sensor data measurement table 800 is a table that stores the measurement data of each sensor node 7, and includes fields of a sensor node ID 800a, measurement time 800b, and a detection voltage 800c, as shown in FIG. 5.

The sensor node ID 800a stores an ID for uniquely identifying the sensor node 7. At the measurement time 800b, measurement time at the sensor node 7 is stored in a form of "yyyymmddhhmmss". The measurement time may be a time at which the equipment management server 5 receives data in practice. A voltage value detected by the sensor node 7 is stored in the detection voltage 800c in units of mV, for example.

Next, a principle of measuring the leakage voltage will be described with reference to FIG. 6.

Figure 6:
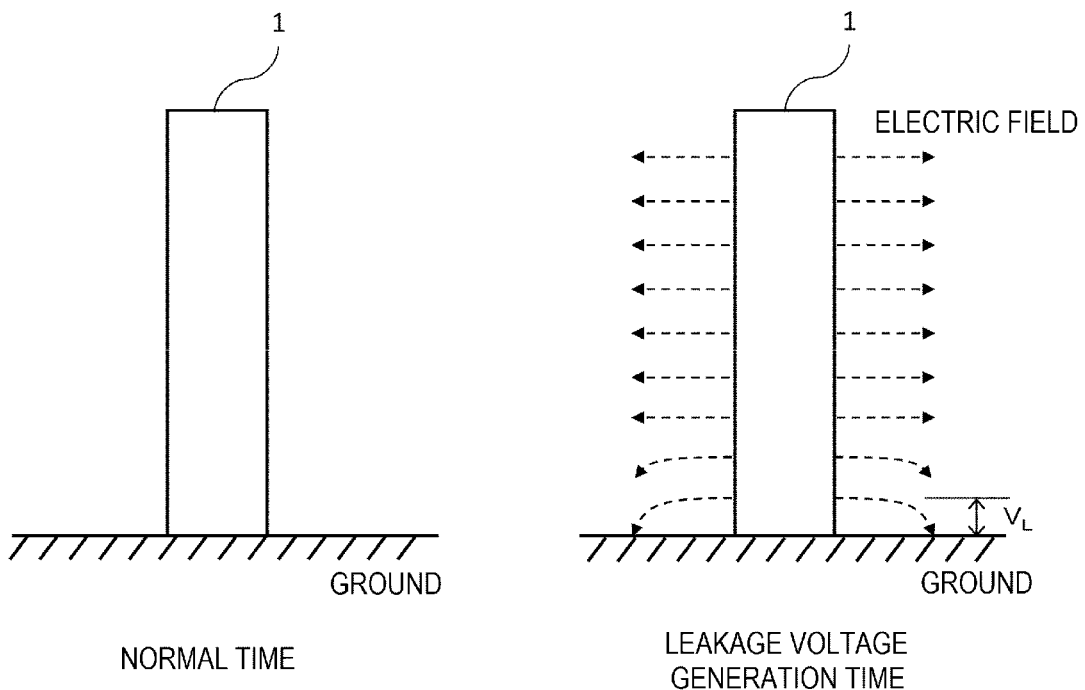
FIG. 6 is a diagram showing a relationship between ground structures.

A description of "normal time" in FIG. 6 is an electric field distribution diagram when no leakage voltage of the ground structure 1 is generated, and a description of "leakage voltage generation time" in FIG. 6 is an electric field distribution diagram when the leakage voltage is generated from the ground structure 1. The ground structure 1 mentioned here is a structure including an electric wiring, and is, for example, a street light, a traffic light, a bus stop, or a utility pole. When the leakage voltage occurs, a leakage voltage $V_L$ is a voltage with respect to the earth (ground), and thus the leakage voltage causes the electric field to be emitted from the ground structure 1 toward the ground and a point at infinity. An electric field intensity of the electric field due to the leakage voltage is proportional to the voltage value, and an AC electric field is formed by the leakage voltage from a commercial AC power supply. Since a proportional constant of amplitude of the leakage voltage and amplitude of the electric field intensity is determined by the shape of the ground structure 1, the leakage voltage can be estimated from the electric field of the surface of the ground structure by preparing the proportional constant in advance. As a method for preparing the proportional constant, it is possible to calculate the proportional constant from dimensions by an electric field analysis by an experimental determination method or a finite element method. In particular, when the ground structure such as a street light or a traffic light has a columnar shape, it is easy to prepare the proportional constant since dominant parameters for the proportional constant are only a diameter of a column and a ground height of a point of interest.

Figure 7:
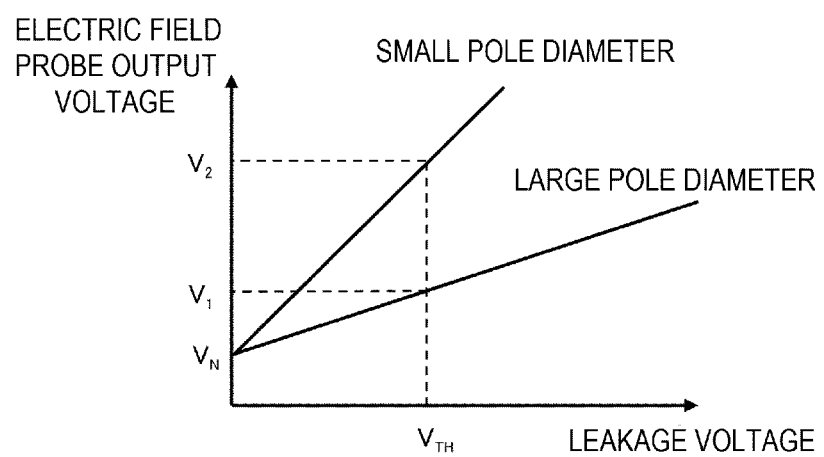
FIG. 7 is a graph showing a relationship between a leakage voltage and an electric field probe output voltage related to a columnar ground structure.

Next, processing of determining the risk of the leakage voltage will be described with reference to FIG. 7.

An electric field probe output voltage increases in proportion to the leakage voltage. On the other hand, there is a finite floor noise $V_N$ due to an environmental electric field noise in amounting environment of the electric field probe 2. Assuming that a leakage voltage level to be detected which has a risk of electric shock is $V_{TH}$, the electric field probe output voltage corresponding to the leakage voltage $V_{TH}$ differs due to an existence of the floor noise and a difference in the proportional constant depending on the shape. Therefore, in order to determine a risk degree of the leakage voltage, it is necessary to know the floor noise and the proportional constant.

First, in order to acquire a value of the floor noise, the sensor data database 501 acquires an electric field probe output voltage value before the leakage voltage is generated, and estimates the electric field probe output voltage value as the floor noise. Based on the floor noise, the threshold value calculation unit 503 calculates a threshold value related to the electric field probe output voltage from the proportional constant (proportional coefficient determined from the ground structure described with reference to FIG. 6) stored in the ground structure database 504.

For example, when the ground structure 1 is a pole and the proportional constant when a pole diameter is large is $C_1$ and the proportional constant when the pole diameter is small is $C_2$, the respective threshold values $V_1$ and $V_2$ can be obtained as $V_1=C_1 \times V_{TH}+V_N$, $V_2=C_2 \times V_{TH}+V_N$ according to a calculation formula of a linear function.

The leakage voltage risk determination unit 505 of the equipment management server 5 compares the threshold value with the electric field probe output voltage to determine whether the leakage voltage has a risk, and when the leakage voltage has a risk, information of the sensor node 7 is displayed on the display device 6. Further, a map may be displayed by the display device 6, and the position of the ground structure in which the leakage voltage is generated may be displayed on the map by a mapping function of the map.

Further, the equipment management server 5 may provide and calculate several stages of the level of the leakage voltage from the detection voltage, quantitatively calculate an electric shock risk degree as an electric shock risk level, and display both the position of the ground structure in which the leakage voltage is generated and the electric shock risk level of the leakage voltage on the map on the display device 6.

As described above, according to the leakage voltage detection system of the present embodiment, as a sensor structure for measurement, it is possible to easily mount the device without the ground and identify and detect in real time the ground structure where the leakage voltage having a risk of the electric shock is generated, the maintenance worker can quickly isolate the ground structure where the leakage voltage is generated and repair the accident location and prevent the electric shock accident.

Second Embodiment

Hereinafter, a second embodiment will be described with reference to FIGS. 8 to 11.

In the first embodiment, as shown by the structure of the electric field probe 2 in FIGS. 3 and 4, an example with one inner electrode and one outer electrode is described.

In the present embodiment, an example of a leakage voltage detection system having a structure of the electric field probe 2 including a plurality of outer electrodes will be described. In the present embodiment, points different from the first embodiment will be mainly described.

Figure 8:
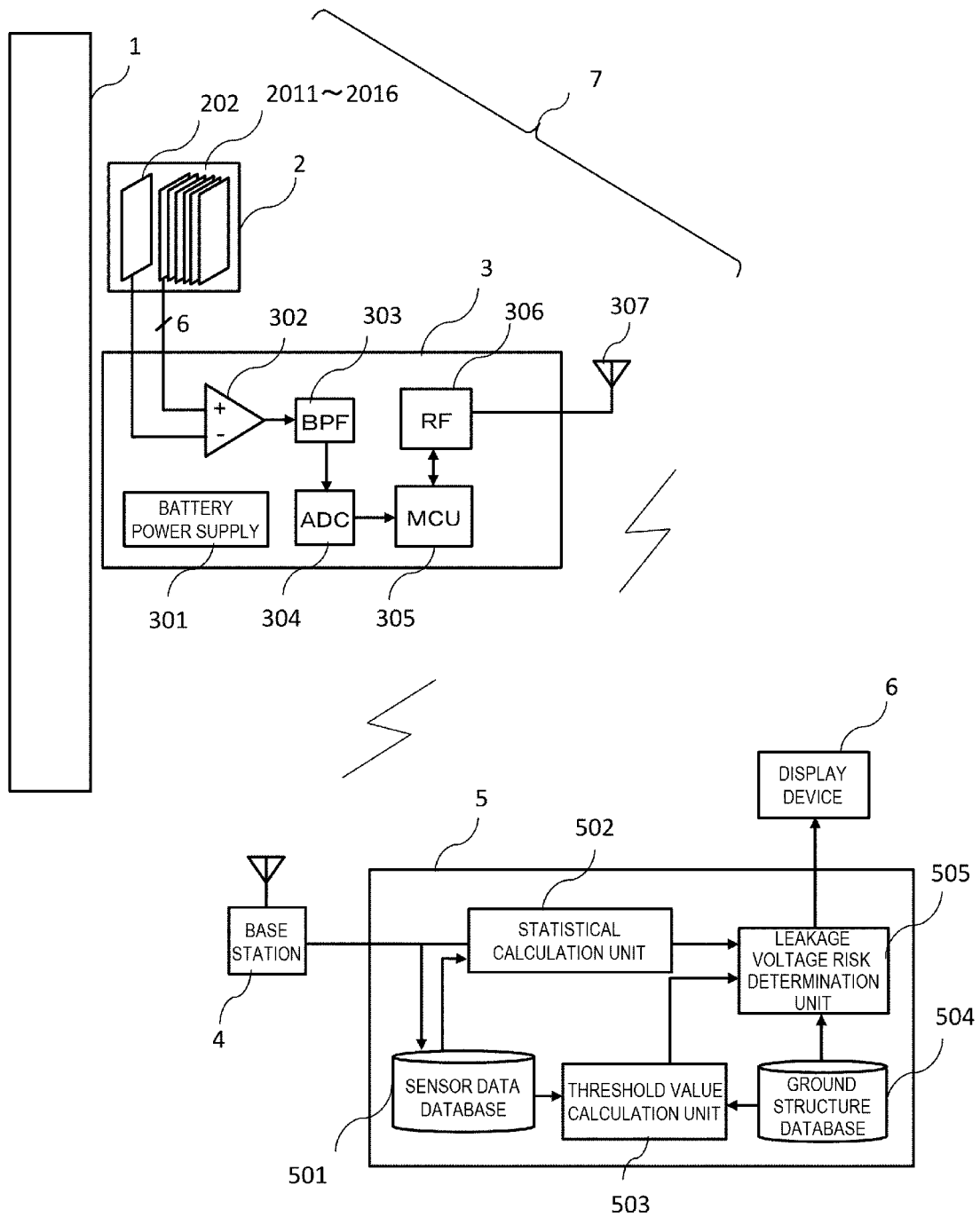
FIG. 8 is a configuration diagram of a leakage voltage detection system according to a second embodiment.

First, a configuration of the leakage voltage detection system according to the second embodiment will be described with reference to FIG. 8.

In the electric field probe 2 of the first embodiment, the outer electrode and the inner electrode face each other one by one, and in the electric field probe 2 of the second embodiment, the outer electrode is divided into a plurality of parts such as outer electrodes 2011 to 2016.

In addition, a statistical calculation unit 502 that performs statistical calculation of a plurality of detection voltages corresponding to the outer electrodes 2011 to 2016 is added to the equipment management server 5 in comparison with that of the first embodiment.

Hereinafter, the structure of the electric field probe according to the second embodiment and processing related thereto will be described in detail.

When the electric field by the electric field probe 2 shown in FIGS. 3 and 4 of the first embodiment is measured and the leakage voltage is detected, instead of the electric field generated by the leakage voltage of the ground structure 1, the electric field generated by an electric device installed in the vicinity of the ground structure 1 may be captured, and the leakage voltage may be erroneously determined. Examples of the electric device installed in the vicinity that can emit such an electric field include a newly installed electric wiring or an electric lamp.

Figure 9A:
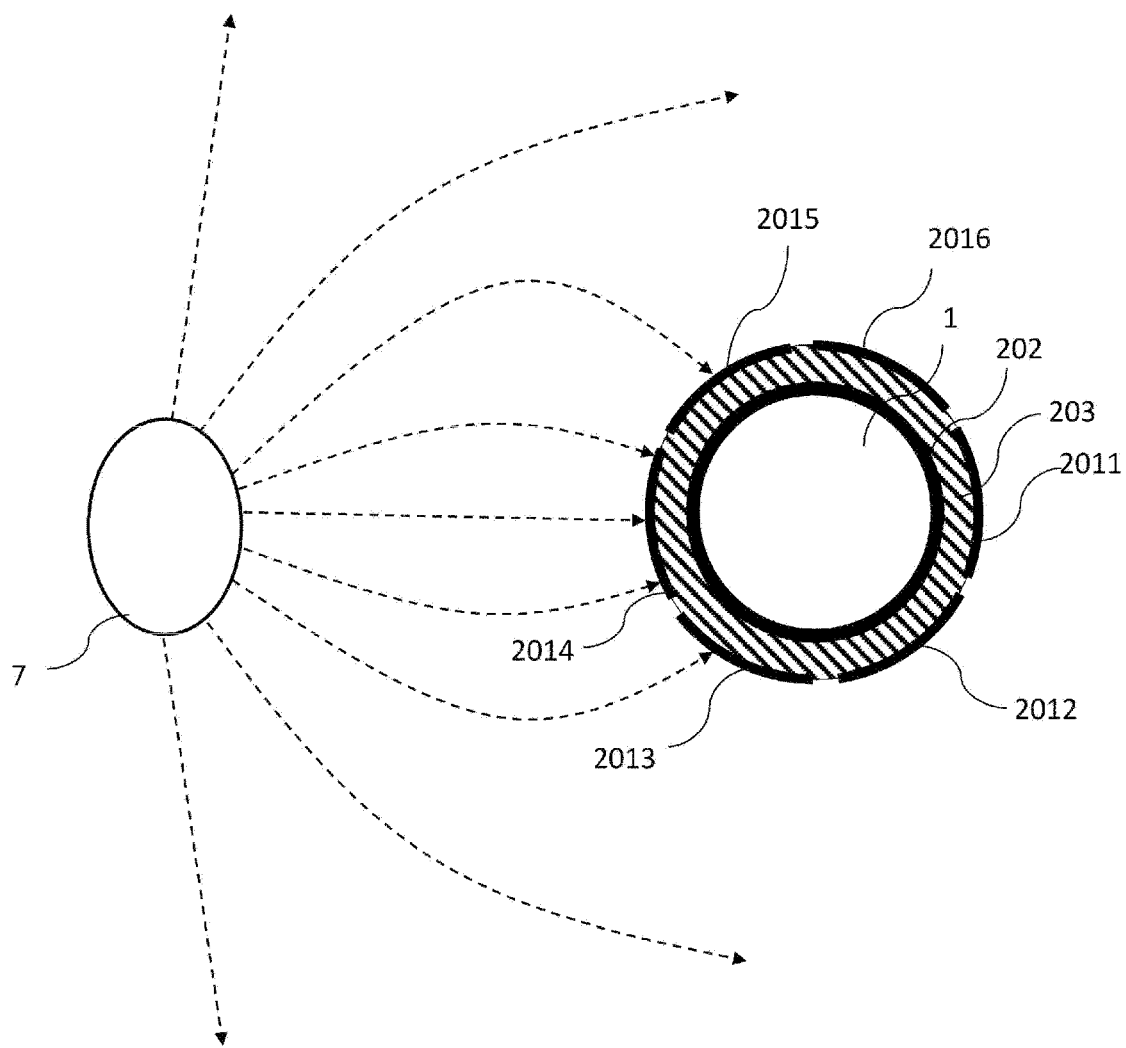
FIG. 9A is a diagram showing a state of an electric field and an electric field probe when a radiation source of the electric field is outside a ground structure.
Figure 9B:
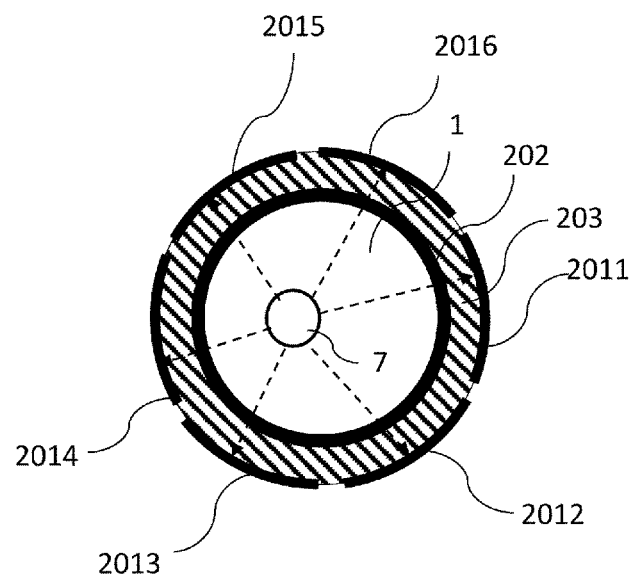
FIG. 9B is a diagram showing a state of an electric field and an electric field probe when the radiation source of the electric field is inside the ground structure.

In order to solve such a problem, as a structure of the electric field probe 2 of the leakage voltage detection system of the present embodiment, as shown in FIGS. 9A and 9B, the plurality of outer electrodes are provided.

As shown in FIGS. 9A and 9B, in the electric field probe 2 of the leakage voltage detection system of the present embodiment, the outer electrode is divided into a plurality of parts such as the outer electrodes 2011 to 2016, and forms a pair with the inner electrode 202 to form a plurality of electric field sensors facing different directions in the circumferential direction.

Figure 10A:
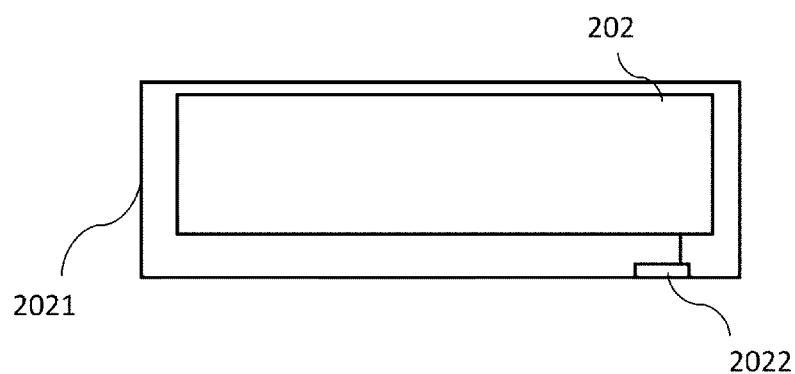
FIG. 10A is a diagram showing a structure in which an electric field probe of the second embodiment is deployed with respect to an inner electrode.
Figure 10B:
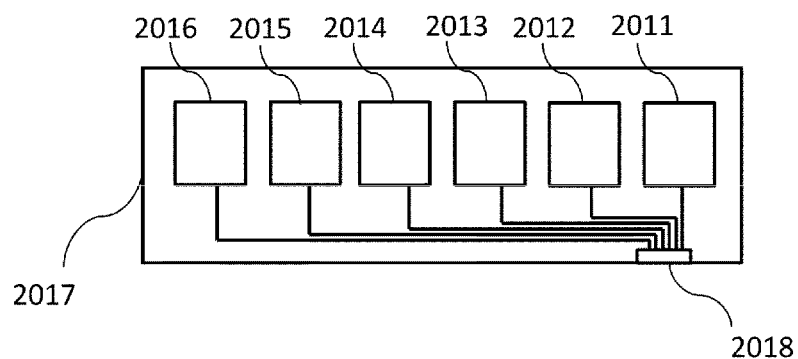
FIG. 10B is a diagram showing a structure in which the electric field probe of the second embodiment is deployed with respect to an outer electrode.

FIG. 10A shows a structure related to the inner electrode 202. The inner electrode 202 is connected to a connector 2022 and is supported and accommodated by a base material 2021. FIG. 10B shows a structure related to the outer electrodes 2011 to 2016, and the outer electrodes 2011 to 2016 are connected to a connector 2018, and are supported and accommodated by a base material 2017.

As shown in FIG. 9A, when a radiation source 7 of the electric field exists in the vicinity of an outer side of the ground structure, the electric field from the radiation source 7 is concentrated and generated in a direction of the ground structure 1 in which the radiation source 7 exists. On the other hand, when the radiation source 7 of the electric field exists inside the ground structure, the electric field from the radiation source 7 is generated substantially evenly on the surface of the ground structure 1, as shown in FIG. 9B.

Here, when respective detection voltages measured between the inner electrode 202 and the outer electrodes 2011 to 2016 are $V_i$ (i=1, . . . , 6), an average thereof is p, and a variance is $\sigma^2$, the following Equation 1 and Equation 2 are established.

$$\mu = \frac{1}{6}\sum_{i=1}^{6} V_i \qquad \text{Equation 1}$$

$$\sigma^2 = \frac{1}{6}\sum_{i=1}^{6} (V_i - \mu)^2 \qquad \text{Equation 2}$$

Figure 11:
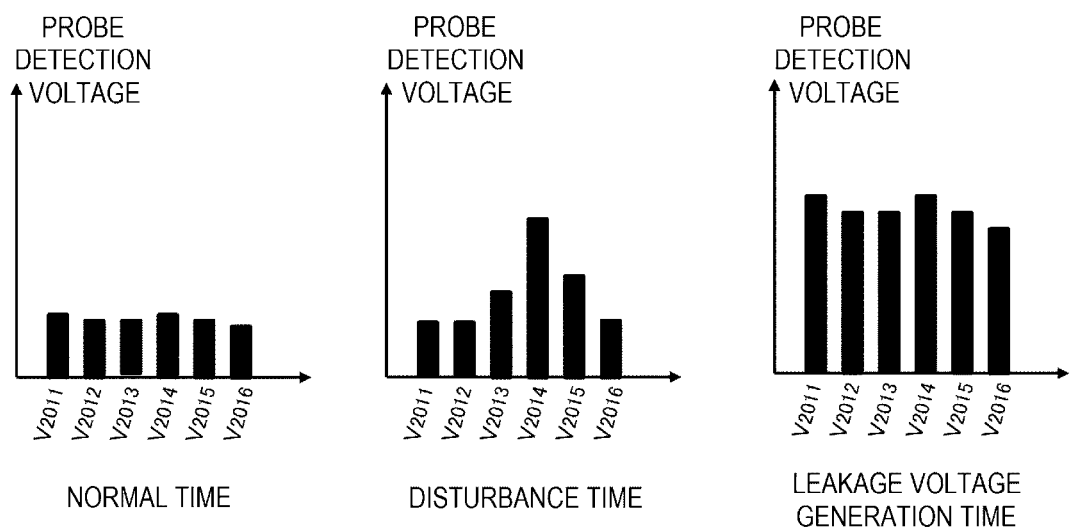
FIG. 11 is a bar graph of a detection voltage for each outer electrode at each of normal time, disturbance time, and leakage voltage generation time.

By dividing the electrode as in the structure of the electric field probe 2 of the present embodiment, the electric field distribution of the ground structure 1 in the circumferential direction is measured, and the detection voltage shown in FIG. 11 is obtained for each electric field probe. In FIG. 11, the voltages generated between the outer electrodes 2011 to 2016 and the inner electrode 202 are denoted by V2011 to V2016.

FIG. 11 is a bar graph showing the detection voltage for each outer electrode at each of normal time, disturbance time, and leakage voltage generation time.

Here, as shown in FIG. 9A, when the radiation source is outside the ground structure 1, a disturbance electric field generated by the radiation source has directivity, and it is expected that the variance is large as indicated by the bar graph of the "disturbance time" in FIG. 11. On the other hand, as shown in FIG. 9B, when the radiation source 7 is inside the ground structure 1 (when the leakage voltage is generated due to an internal wiring), there is no directivity, and it is expected that the variance is small as indicated by the bar graph of the "leakage voltage generation time" in FIG. 11.

That is, by setting an appropriate variance threshold value and determining whether the detection voltage is due to a disturbance or the leakage voltage of the ground structure 1, it is possible to distinguish between the disturbance and the leakage voltage, and it is possible to improve detection accuracy of the leakage voltage.

Third Embodiment

Hereinafter, a third embodiment will be described with reference to FIG. 12.

The leakage voltage detection system of the first embodiment is intended to prevent an electric leakage accident by a method such as operating the sensor box 3 on the battery power supply 301, transmitting the detected leakage voltage information to the equipment management server 5, and dispatching the maintenance worker based on the information.

A leakage voltage detection system of the present embodiment further describes a configuration capable of improving safety by detecting the leakage voltage based on the configuration of the first embodiment.

Hereinafter, a configuration of the leakage voltage detection system according to the third embodiment will be described with reference to FIG. 12.

Figure 12:
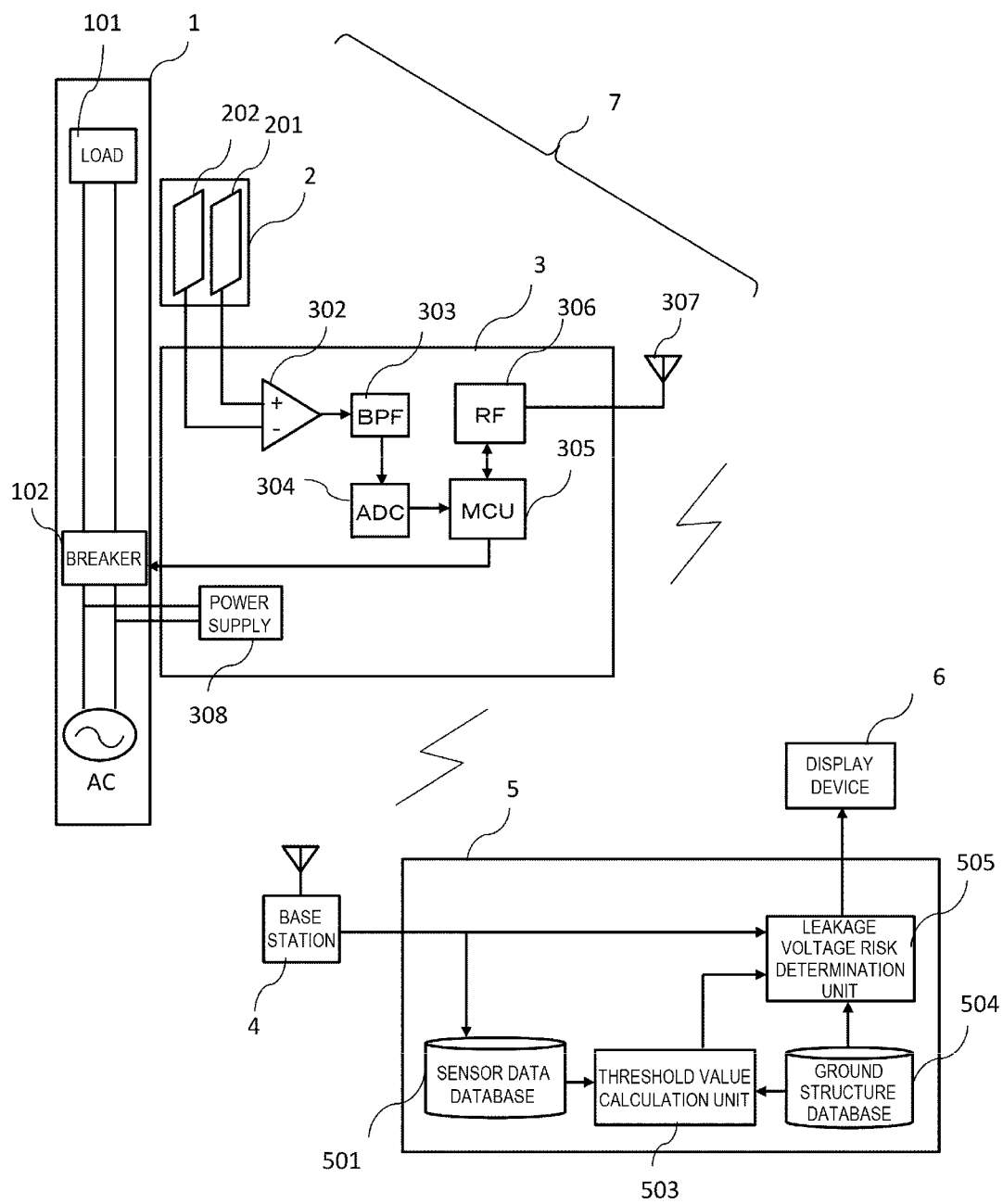
FIG. 12 is a configuration diagram of a leakage voltage detection system according to a third embodiment.

The ground structure 1 of FIG. 12 shows a configuration in which a load 101 is operated by a commercial AC power supply. The sensor box 3 is operated by a power supply 308 obtained by converting the commercial AC power supply to a DC circuit.

Then, when a breaker 102 is provided between the load 101 and the commercial power supply and the leakage voltage is detected (when the detection voltage is larger than a predetermined threshold value), according to an instruction from the MCU 305, the leakage voltage is remotely cut off by opening a contact of the breaker 102.

As described above, according to the configuration of the sensor box 3 of the present embodiment, it is possible to cut off the leakage voltage without waiting for a worker to ensure the site as in the first embodiment, and it is possible to improve safety.

What is claimed is:

1. A leakage voltage detection system comprising:
a sensor node mounted on a ground structure; and
an equipment management server that determines a risk of a leakage voltage on the ground structure based on detection voltage information from the sensor node, wherein
the sensor node includes
an electric field probe that measures a potential difference caused by an electric field detected by electrodes, and
a sensor box that detects the potential difference between the electrodes of the electric field probe and transmits wirelessly the potential difference to the equipment management server as a detection voltage, and
the equipment management server determines the risk of the leakage voltage where the sensor node is mounted based on the received detection voltage from the sensor node, and outputs information on determination of the risk of the leakage voltage,
wherein one of the electrodes of electric field probe is an outer electrode plate; and
wherein another one of the electrodes of the electric filed probe is an inner electrode plate placed between the outer electrode plate and the ground structure, without electrical contact to the ground structure, a surface of the inner electrode plate is placed along with a surface of the ground structure.

2. A leakage voltage detection system comprising:
a sensor node mounted on a ground structure; and
an equipment management server that determines a risk of a leakage voltage on the ground structure based on detection voltage information from the sensor node, wherein
the sensor node includes
an electric field probe that measures a potential difference caused by an electric field detected by electrodes, and
a sensor box that detects the potential difference between the electrodes of the electric field probe and transmits the potential difference to the equipment management server as a detection voltage, and
the equipment management server determines the risk of the leakage voltage where the sensor node is mounted based on the received detection voltage from the sensor node, and outputs information on determination of the risk of the leakage voltage; and
wherein
the electric field probe includes an outer electrode and an inner electrode, and
the electric field probe has a structure in which the inner electrode and the outer electrode are wrapped in order in a circumferential direction of the ground structure on a column to be measured.

3. The leakage voltage detection system according to claim 2, wherein
an electric piping of the ground structure is provided inside the inner electrode.

4. The leakage voltage detection system according to claim 2, wherein the electric field probe includes a plurality of pairs of electrodes that obtain the potential difference.

5. A leakage voltage detection system comprising:
a sensor node mounted on a ground structure; and
an equipment management server that determines a risk of a leakage voltage on the ground structure based on detection voltage information from the sensor node, wherein
the sensor node includes
   an electric field probe that measures a potential difference caused by an electric field detected by electrodes, and
   a sensor box that detects the potential difference between the electrodes of the electric field probe and transmits the potential difference to the equipment management server as a detection voltage, and
the equipment management server determines the risk of the leakage voltage where the sensor node is mounted based on the received detection voltage from the sensor node, and outputs information on determination of the risk of the leakage voltage;
the electric field probe includes a plurality of pairs of electrodes that obtain the potential difference; and
wherein
the equipment management server obtains an average value and a variance of detection voltages detected from the pairs of electrodes, and
the risk of the leakage voltage is determined based on whether a value of the variance exceeds a predetermined threshold value.

6. The leakage voltage detection system according to claim 1, further comprising:
a breaker that cuts off electricity energized to the ground structure, wherein
when the sensor box detects a detection voltage that exceeds a predetermined threshold value, the sensor box transmits an instruction of cutting off the energized electricity to the breaker.

\* \* \* \* \*